United States Patent [19]

Schweitzer, Jr.

[11] 4,251,770
[45] Feb. 17, 1981

[54] COMBINED FAULT AND VOLTAGE INDICATOR

[76] Inventor: Edmund O. Schweitzer, Jr., 1520 McCormick, Mundelein, Ill. 60060

[21] Appl. No.: 51,402

[22] Filed: Jun. 25, 1979

[51] Int. Cl.³ ............................................. G01R 19/14
[52] U.S. Cl. ..................................... 324/133; 324/52; 340/654
[58] Field of Search ................ 324/133, 120, 51, 122, 324/127, 52; 340/664, 650, 651, 654, 660

[56] References Cited

U.S. PATENT DOCUMENTS

| | | | |
|---|---|---|---|
| 3,443,158 | 5/1969 | Arndt | 340/360 |
| 3,639,833 | 2/1972 | Tachick | 324/133 |
| 3,676,740 | 7/1972 | Schweitzer, Jr. | 324/133 |
| 3,906,477 | 9/1975 | Schweitzer, Jr. | 324/133 |
| 4,063,171 | 12/1977 | Schweitzer, Jr. | 324/133 |
| 4,152,643 | 5/1979 | Schweitzer, Jr. | 324/133 |

Primary Examiner—David K. Moore
Attorney, Agent, or Firm—Lockwood, Dewey, Alex & Cummings

[57] ABSTRACT

A combined fault and voltage indicator includes a rotatably-mounted target viewable from the exterior of the indicator for indicating the occurrence of a fault and a lamp viewable from the exterior of the indicator for indicating system operating voltage. The target is positioned in a reset-indicating state by a reset circuit which periodically energizes a first winding to position a permanent magnet mounted for rotation with the target. Upon occurrence of a fault circuitry within the indicator energizes a second winding to reposition the target to a fault-indicating position. The lamp is caused to flash at a rate which indicates the operating voltage of the system.

8 Claims, 6 Drawing Figures

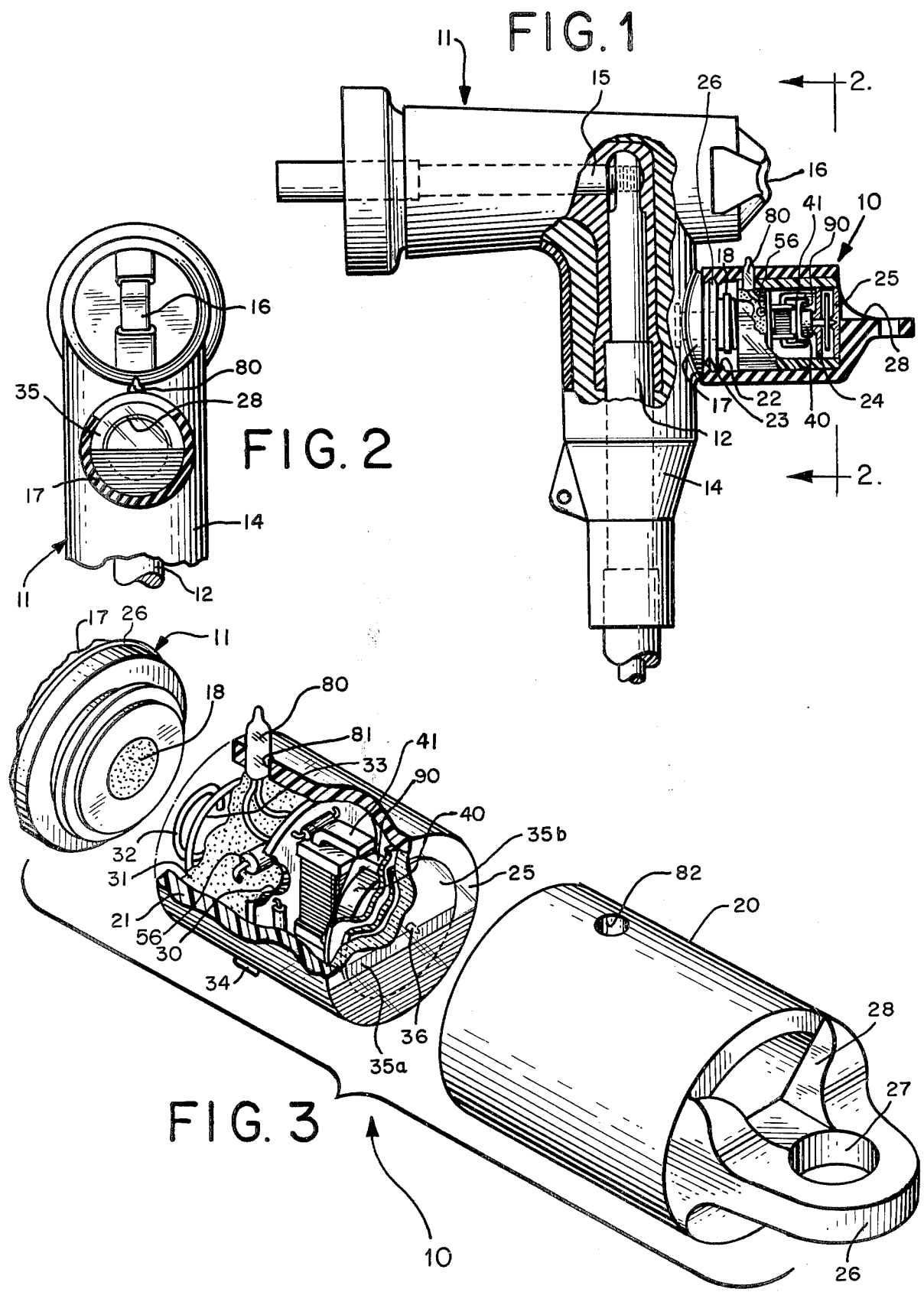

COMBINED FAULT AND VOLTAGE INDICATOR

BACKGROUND OF THE INVENTION

The present invention relates generally to current and voltage sensing devices for electrical systems, and more particularly to automatically resetable combined alternating current fault and voltage indicators.

With the increased use of underground electrical distribution systems wherein primary and secondary feeder cables are directly buried in the ground, the need has arisen for improved detection apparatus for determining the location of a short circuit or fault in the system cables or associated electrical components, and the voltage level present in a particular circuit of the system.

Various types of fault indicators have been constructed for detecting faults in such systems, including clamp-on type fault indicators, which clamp directly over cables in the system, and test-point type fault indicators, which are mounted over test points in the cables or associated connectors. Such fault indicators may be either of the manually reset type, wherein it is necessary that the indicator be physically reset following each fault, or of the automatically reset type, wherein a fault indication is reset upon restoration of line current. The automatically reset type is beter adapted for use in underground distribution systems in that it is not necessary to gain access to the fault indicator following occurrence of a fault. Examples of such automatically reset fault indicators are found in products manufactured by E. O. Schweitzer Mfg. Co. of Mundelein, Illinois, in U.S. Pat. Nos. 3,676,740, 3,906,477 and 4,063,171 of the present inventor, and in the copending application of the present inventor, Ser. No. 958,103, filed Nov. 6, 1978.

Detection of fault currents by self-resetting fault indicators is often most advantageously accomplished by means of a read switch located within the indicator housing having contacts in close proximity to the conductor being monitored. Upon occurrence of an abnormally high fault-associated magnetic field around the conductor, the contacts close and actuate circuitry which magnetizes an internal pole piece to position to a trip position a target indicator visible from the exterior of the indicator. Upon restoration of current in the conductor another circuit is actuated to reposition the target indicator to a reset non-fault indicating position. Preferably, as in the afore-identified application Ser. No. 958,103, power for the trip and reset circuits is derived from the circuit being monitored, by capacitive coupling, to preclude the need for a separate power source for the fault detector.

In many applications the need arises for a voltage indication in addition to a fault indication so that the presence of voltage, and the level of voltage in the monitored circuit, can be readily determined. Heretofore this has been accomplished by a separate device, typically employing a circuit of the capacitor-discharge type, which provides a flashing rate proportioned to circuit voltage level. One preferred form of such a voltage indicator for use on a test point terminal is described in the copending application of the present inventor, Ser. No. 895,151, filed Apr. 10, 1978, now U.S. Pat. No. 4,152,643.

The present application is directed to a combined indicator wherein both fault and voltage indications are simultaneously provided in a single compact device with a minimum number of components, thereby providing maximum convenience of use and economy of manufacture.

Accordingly, it is a general object of the present invention to provide a new and improved combined fault and voltage indicator.

It is a more specific object of the present invention to provide a compact and economical combined fault and voltage indicator which provides simultaneous indications of fault occurrence and operating voltage.

SUMMARY OF THE INVENTION

The invention is directed to a combined fault and voltage indicator operable from an AC electrical circuit for indicating the occurrence of a fault in and the voltage level of the circuit. The indicator includes a housing adapted for mounting in proximity to the conductor, and status indicating means having a reset-indicating state and a fault-indicating state. First circuit means operable from a uni-directional current are provided for conditioning the status indicating means to the reset state upon restoration of normal current in the conductor, and second circuit means operable from a uni-directional current may be provided for conditioning the status indicating means to the fault-indicating state in response to the occurrence of a fault current in the conductor. A uni-directional current source capacitively coupled to the conductor and operable from the alternating current therein is provided for developing on an output terminal with reference to a plane of reference potential a unidirectional current for operating the circuit means. Means including a gas-discharge lamp visible from the exterior of the housing, and a capacitor, provide a voltage-indicating circuit for supplying the unidirectional current to the first and second circuits, one terminal of the lamp being connected to the source, the capacitor being connected between the other terminal of the lamp and the plane of reference potential, and the circuit means being coupled across the capacitor and being supplied with unidirectional operating current therefrom.

BRIEF DESCRIPTION OF THE DRAWINGS

The features of the present invention, which are believed to be novel, are set forth with particularity in the appended claims. The invention, together with the further advantages thereof, can best be understood by reference to the following description taken in conjunction with the accompanying drawings, in the several figures in which like reference numerals identify like elements, and in which:

FIG. 1 is an elevational view, partially in section, illustrating a resettable test-point combined fault and voltage indicator constructed in accordance with the present invention mounted on the test-point terminal of a plug-in terminal connector;

FIG. 2 is a cross-sectional view of the combined fault and voltage indicator and the connector taken along line 2—2 in FIG. 1; FIG. 3 is a fragmentary perspective view of the combined fault and voltage indicator in a partially disassembled state;

DESCRIPTION OF THE PREFERRED EMBODIMENT

Figure 4A:
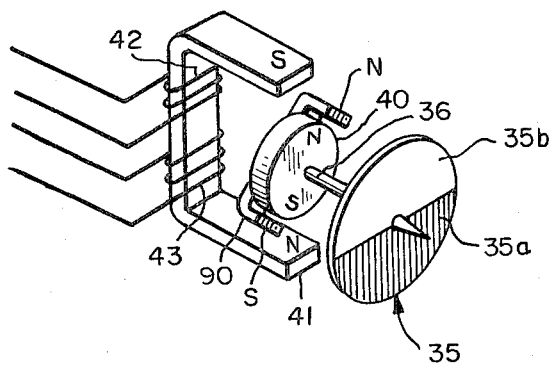
FIGS. 4a and 4b are diagrammatic views showing the principal components of the combined fault and voltage indicator in a reset state.

Referring to the drawings, and particularly to FIGS. 1–3, a combined fault and voltage indicator 10 constructed in accordance with the invention is shown in conjunction with a conventional plug-in terminal connector 11 of the type commonly used in high voltage alternating current systems for establishing plug-in connections to transformers or other devices (not shown). As shown, the connector 11 includes generally an axial conductor 12 extending through an insulating jacket 13 encased in an electrically-conductive sheath 14, the sheath being grounded in accordance with conventional practice. A plug-in receptacle 15 extends from conductor 12 and is arranged to connect with a complimentary contact on the transformer or device. An arcuate member 16 having ends anchored in the conductive sheath 14 extends from the connector to receive the hook end of a lineman's tool to facilitate removal of the connector from the transformer or other device.

In accordance with conventional practice, connector 11 includes a test-point terminal 17 which comprises a projection of the insulating jacket 13 and an electrical contact 18 embedded in the end thereof.

The combined fault and voltage indicator 10 comprises an electrically conductive hollow rubber outer shell 20 which is open at one end for mounting to the test-point terminal 17. A correspondingly sized cylindrical transparent plastic housing 21 containing the electrical components of the voltage indicator circuit is contained within the rubber outer shell, and held in position within the shell by an annular flange portion 22 on the inside surface of the shell. The annular flange portion also extends inwardly at the open end of the shell to form a rim portion 23 which secures the shell over the test-point. The cylindrical housing 21 includes an integral partition 24 which serves as a mask and spacing element, and a transparent end cap portion 25 which is sonically welded to the end of the housing.

When the combined indicator 10 is installed on the test-point terminal 17 the annular end flange portion 23 of the outer shell snaps over an annular rib portion 26 on the terminal. The outer surface of the annular end flange 23 engages the electrically conductive connector sheath 14 to establish an electrical ground for shell 20. At the closed end of the shell a tab portion 26 having an aperture 27 therethrough is provided to facilitate removal of the test-point cap with a conventional hooked lineman's tool. A window 28 in the end of the outer shell allows the end of housing 21 to be viewed.

Referring to FIGS. 3 and 5, a disc-shaped insulator board 30 is positioned perpendicular to the axis of the housing in a location intermediate the ends thereof. The insulator board, which may be secured in position by an epoxy material 31 filling the housing, serves as mounting means for the electrical components of the indicator circuitry. An electrical connection is established between this circuitry and test-point 18 by means of a helical spring 32, the spring being connected to a wire conductor 33 extending from the circuit board at one end, and being resiliently pressed against contact 18 at its other end. An electrical ground connection is established to the circuit board by means of an additional electrical conductor 34 compressively wedged between housing 21 and the electrically conductive grounded outer shell 20.

To provide an indication of the occurrence of a fault current in conductor 12, the fault indicator includes within the lower end of housing 21 a disc-shaped target 35 which is mounted for rotation on a pivot 36. The face of the target disc has a red segment 35a and a white segment 35b, only one of which is visible at a time through window 28 and the transparent end of housing 21.

Figure 4B:
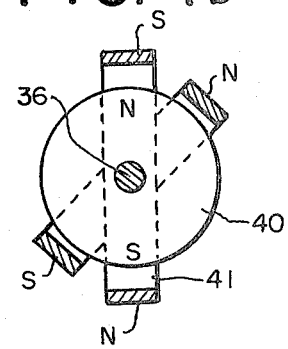

Secured to and pivotal with target 35 is a target permanent magnet 40 which is formed of a magnetic material having a high coercive force, such as ceramic, and is magnetically polarized to form two magnetic poles of opposite gender, as indicated in FIGS. 4 and 5, with opposite magnetic polarities along a diameter of the magnet. The target disc 35 and its permanent magnet 40 are biased to the position shown in FIGS. 4a and 4b when the fault indicator is in a non-tripped or reset condition by means of a stationary generally U-shaped magnetic pole piece 41, which is located within housing 21 generally co-planar with the axis of rotation of target disc 35.

The pole piece 41, which is preferably formed of a magnetic material having a relatively low coercive force, such as a chrome steel, is biased at its projecting ends to the magnetic polarities indicated in FIGS. 4a and 4b. As shown in FIG. 3, the ends of the pole piece extend along the side wall of housing 21, in close proximity to target magnet 40. As a result, the opposite polarity magnetic poles of the target magnet 40 are attracted to position the target disc 35 as shown. In this position the red segment 35a of the target disc is not visible through window 28, and all that is seen is the white segment 35b.

Figure 5A:
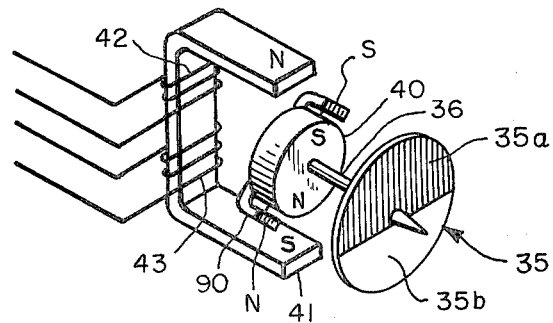
FIGS. 5a and 5b are diagrammatic views similar to FIGS. 4a and 4b, respectively, showing the principal components of the combined fault and voltage indicator in a tripped state.
Figure 5B:
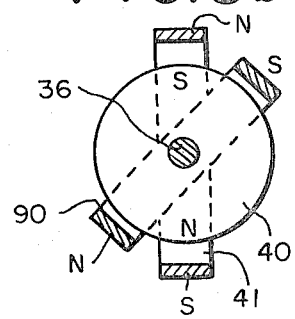

On the occurrence of a fault current in conductor 12, which may, for example, exceed 400 amperes, pole piece 41 is remagnetized to the magnetic polarities shown in FIGS. 5a and 5b by momentary energization of a trip winding 42 on the center section of the pole piece. As a result, the poles of magnet 40 are repelled by the adjacent like-gender poles of the pole piece and the target disc is caused to rotate 180° to the tripped position shown in FIGS. 5a and 5b. In this position, the red segment 35b of the target disc is visible through window 28, and a lineman viewing the fault indicator is advised that a fault current has flowed through conductor 12.

The target disc remains in the fault indicating position until the ends of pole piece 41 are subsequently remagnetized to the magnetic polarities shown in FIGS. 4a and 4b by momentary energization of a reset winding 43 on the center section of the pole piece. As a result, the target magnet 40, and hence the target disc 35, are caused to rotate from the tripped position shown in FIGS. 5a and 5b to the reset position shown in FIGS. 4a and 4b, and the fault indicator is conditioned to respond to a subsequent fault current.

Energization of windings 42 upon occurrence of a fault current in conductor 12, and energization of winding 43 upon restoration of current in conductor 12 following a fault, is accomplished by means of externally-powered circuitry contained within the fault indicator. Referring to the schematic diagram shown in FIG. 6, windings 42 and 43 are connected end-to-end for independent energization upon occurrence of fault and reset conditions, respectively. To obtain operating power for these windings, a unidirectional current source in the form of a bridge rectifier network 50, consisting of diodes 51-54, is provided. One input terminal of this network, formed at the juncture of the anode of diode 51 and the cathode of diode 52, is connected through the helical spring 32 to test-point contact 18. The other input terminal, formed at the anode of diode 53 and the cathode of diode 54, is connected to ground through the electrically conductive sheath 20 of the fault indicator. With this arrangement, high voltage alternating current carried in conductor 12 is capacitively coupled to the bridge rectifier network, resulting in the production of a pulsating unidirectional current at the output terminals of the network.

The positive polarity output terminal of the bridge rectifier network, formed at the cathodes of diodes 51 and 53, is connected to one contact 55 of a reed switch 56, to the end terminals of windings 42 and 43, and to respective terminals of capacitors 83, 57 and 58, thereby forming a plane of reference potential for these components. The negative polarity output terminal of the bridge rectifier network, formed at the juncture of the anodes of diodes 52 and 54, is connected through a gas discharge lamp 80 to the remaining terminal of capacitor 57, and through a forward-biased diode 59 to the remaining terminal of capacitor 58. With this arrangement, capacitor 83 is charged by the pulsating unidirectional current developed by bridge rectifier network 50 during normal current flow in conductor 12 to develop a unidirectional current source substantially free of pulsations.

To provide for periodic energization of reset winding 43 during normal current flow in conductor 11, the remaining end terminal of winding 43 is connected through a silicon controlled rectifier (SCR) 60 to the negative polarity terminal of capacitor 57. Periodic conduction through SCR 60 is obtained by connecting the gate electrode of that device to the positive polarity output terminal of bridge rectifier network 50 through a resistor 61 and a bilateral diode 62, and to the cathode of SCR 60 by a resistor 63. With this arrangement, SCR 60 is periodically triggered into conduction when the voltage developed across bilateral diode 62 as a result of capacitor 57 being charged by bridge rectifier 50 reaches the threshold level of the bilateral diode.

In operation, under normal current flow conditions, the voltage developed across capacitor 57 as the capacitor is charged by bridge rectifier network 50 progressively increases with time, until the threshold breakdown voltage of bilateral diode 62 is reached, at which time SCR 60 is triggered and capacitor 57 discharges through winding 43. Diode 59 prevents capacitor 58 from being discharged through SCR 60 and winding 43, leaving the capacitor available for energizing winding 42 in response to a fault condition.

Trip winding 42 is energized upon occurrence of a fault current in conductor 12 by discharge of capacitor 58 through a second silicon controlled rectifier 70. Conduction is established through SCR 70 by closure of the contacts 55 of reed switch 56, which is positioned within housing 21 in close proximity to conductor 12 such that the alternating magnetic field produced in the vicinity of conductor 12 upon generation of a fault current is sufficient to close the contacts of the reed switch. The gate electrode of SCR 70 is connected through a bilateral diode 71 and a resistor 72 to the remaining contact of reed switch 56, and by a resistor 73 to the SCR cathode. The juncture of resistor and bilateral diode 71 is connected by a capacitor 74 to capacitor 58.

Upon occurrence of a fault current in conductor 12, the positive polarity output terminal of bridge rectifier network 50 is connected through the closed contacts of reed switch 56 and the circuit comprising resistor 72, bilateral diode 71, resistor 73 and capacitor 74 to the gate electrode of SCR 70, causing that device to be rendered conductive following a predetermined time delay. At this time capacitors 57 and 58 are caused to discharge through SCR 70 and energize winding 42. The resulting magnetic flux in the U-shaped pole piece 41 reverses the magnetic pole polarities of the pole piece and causes rotation of the target as previously described.

To preclude the possibility of windings 42 and 43 being simultaneously actuated by simultaneous conduction through SCR 70 and SCR 60, a predetermined time delay in conduction through SCR 70 is introduced following occurrence of a fault current in conductor 12. This is accomplished by resistor 72 and capacitor 74, which together form an RC time constant in the gate circuit of SCR 70. Upon closure of the contacts of reed switch 56 it is necessary that capacitor 74 charge through resistor 72 to the threshold voltage of bilateral diode 71 before sufficient gate electrode current is supplied to SCR 70 to initiate conduction in that device.

The actual time delay provided is determined by the resistance of resistor 72, the capacitance of capacitor 74, the threshold voltage of bilateral diode 71, and the voltage level developed means capacitor 58, and is designed to insure that should a fault occur simultaneously with the periodic energization of winding 43, capacitor 57 will have completely discharged through that winding prior to winding 42 being energized to signal the fault.

Referring to FIGS. 4 and 5, to avoid any possibility of rotor 35 becoming stalled upon reversal of the magnetic polarities of pole piece 41, as might happen with a rotor being perfectly centered between the poles of pole pieces 41 and having a degree of bearing friction, the fault indicator includes an auxiliary U-shaped pole piece 90 positioned adjacent target magnet 40 coaxial with and at an angle to pole piece 41. The effect of the magnetic poles induced in auxiliary pole piece 90 is that upon reversal of the gender of the poles of pole piece 50 following occurrence of a fault current the auxiliary poles exert a rotational force on the most adjacent poles of the permanent rotor magnet 40 associated with target 35. This results in a rotational movement being exerted on the target, tending to turn the target in a predetermined (counter-clockwise in FIGS. 4 and 5) direction such that the target is precluded from remaining in its reset position, even if it should be perfectly positioned and have a degree of bearing friction. Once rotation has been established, the greater force of the main pole piece 41 overcomes the effect of the auxiliary pole piece 90 and rotation continues until the target is aligned as shown in FIGS. 5a and 5b.

In accordance with the invention, in addition to supplying unidirectional current to the trip and reset circuits, the gas-discharge lamp 80 provides an indication of the voltage level in conductor 12. The indication is in the form of a variable flashing rate, which not only alerts the lineman to the existence of voltage in the conductor, but also allows the lineman to determine the voltage level in the conductor by timing the repetition rate of the flashes.

Figure 6:
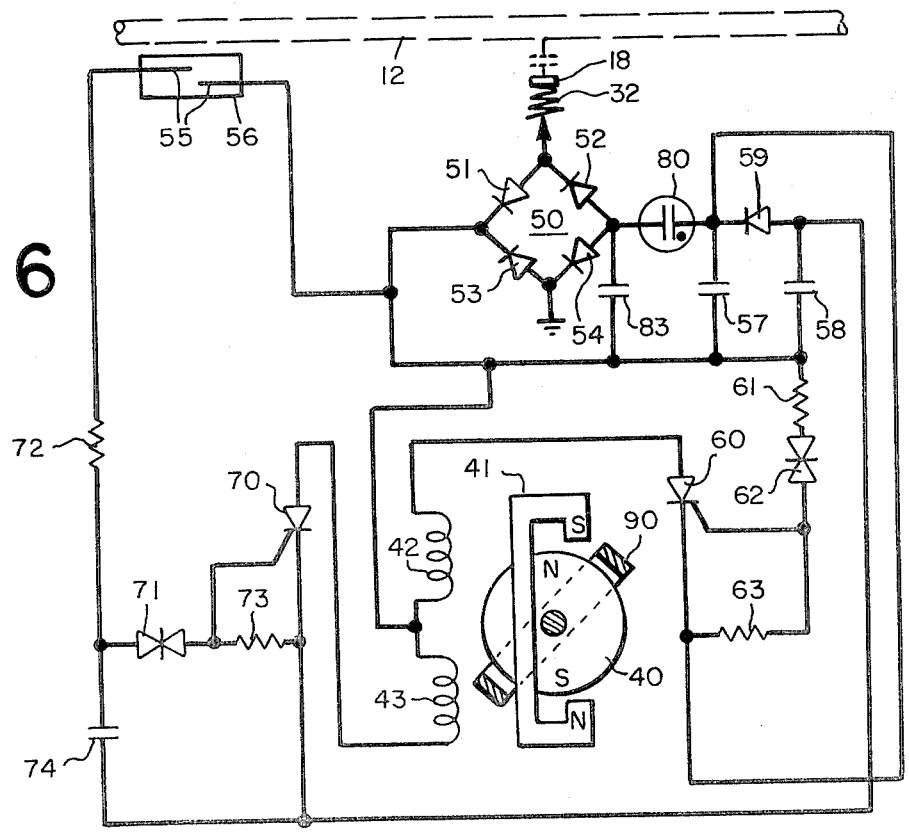
FIG. 6 is an electrical schematic diagram of the combined fault and voltage indicator.

Referring to FIG. 6, during normal operation of the power system capacitor 83 is charged by bridge rectifier network 50 at a rate dependent on the voltage level in conductor 12. Assuming capacitors 57 and 58 are initially in a discharged state, the voltage level across capacitor 83, and hence the voltage level across gas discharge lamp 80, eventually rises to the discharge threshold voltage of the lamp, at which time the lamp becomes conductive and emits light in a manner well known to the art. This causes a portion of the charge on capacitor 83 to be transferred through the lamp to capacitor 57, and through the lamp and forward-biased diode 59 to capacitor 58. As a result, the voltage level across the lamp drops and eventually conduction through the lamp is terminated and the lamp is extinguished as the voltage level falls below the minimum threshold level of the lamp. At this time capacitor 83 again begins to charge, and when the threshold voltage is again reached the charging cycle is repeated.

In practice, in the absence of a fault, capacitor 58 reaches and remains in a substantially constant state of charge, and hence the voltage level across capacitor 58 is substantially constant. However, capacitor 57, which is isolated from the reset circuit by the now back-biased diode 59, is periodically discharged by operation of the reset circuit, so that periodic conduction of lamp 80 is necessary to reestablish and maintain the charge on this capacitor. The number of conduction cycles of lamp 80 necessary for this purpose is dependent on the voltage level of the unidirectional current produced across capacitor 83 by bridge rectifier network 50, which in turn is dependent on the voltage level in conductor 12. Thus, by counting the number of flashes occurring in gas discharge lamp 80 between successive operations of the reset circuit, it is possible to determine the voltage level in the conductor.

In one successful embodiment of the invention for use in conjunction with an electrical circuit operating at 5.0 KV, the following components were utilized:

Diodes 51–54 and 59—Type IN4007
Capacitor 58—3.3 mfd 100 VDC
Capacitor 83—0.1 mfd 100 VDC
Capacitor 57—2.2 mfd 100 VDC
Neon lamp—NE 211

With this circuit, a 5.0 kilovolt line voltage provided a total of approximately 150 flashes between successive reset intervals of approximately three minutes duration.

A self-resetting circuit condition indicator has been described which provides both fault and voltage indications with a minimal number of circuit components. The indicator is compact, and requires no more space than existing fault-only indicators.

It will be appreciated that the circuit of the present invention can be incorporated in other types of self-resetting fault indicators, such as those intended for clamp-on installation on an electrical conductor, and those intended for direct connection to an external source of excitation. Furthermore, the circuit may be employed in a magnetically-tripped fault indicator, wherein only a reset circuit is provided and no trip circuit is required, since the trip circuit is not required for operation of the circuit.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A combined fault and voltage indicator for indicating the occurrence of a fault current and the presence of a voltage in an alternating current conductor, comprising, in combination:

a housing adapted for mounting on said conductor;
status indicating means within said housing having reset-indicating and fault-indicating states discernible from the exterior of said housing;
fault detecting means within said housing responsive to the occurrence of a fault current in the conductor for conditioning said status indicating means to said fault indicating state;
reset circuit means within said housing periodically operable from an applied unidirectional current for conditioning said status indicating means to said reset indicating state;
a unidirectional current source within said housing operable from alternating current in said electrical conductor, the output voltage of said source being dependent on the voltage level of said alternating current, said unidirectional current source including a rectifier network having input and output terminals, one of said input terminals being capacitively coupled to said conductor and the other of said input terminals being connected to ground, and a first capacitor connected across said output terminals; and
voltage indicating circuit means within said housing comprising a gas-discharge lamp visible from the exterior of said housing, and a second capacitor, said discharge lamp and said second capacitor being connected in series between said output terminals of said rectifier network, and said reset circuit means being connected across said second capacitor, whereby said periodic operation of said reset circuit periodically discharges said second capacitor and said discharge lamp periodically conducts to recharge said second capacitor, the rate of said periodic conduction being dependent on the voltage level in the conductor.

2. A combined fault and voltage indicator as defined in claim 1 wherein said fault detecting means comprise fault circuit means operable from an applied unidirectional current for conditioning said status indicating means to said reset state, and wherein said fault circuit means are connected across said second capacitor.

3. A combined fault and voltage indicator as defined in claim 2 wherein said fault circuit means includes a third capacitor, and means including a diode connected between said second capacitor and said third capacitor for preventing said reset circuit from discharging said third capacitor upon said periodic operation thereof.

4. A combined fault and voltage indicator as defined in claim 1 wherein said gas-discharge lamp is a neon lamp.

5. A fault indicator as defined in claim 1 wherein said status indicating means comprise a mechanical flag member having a first position corresponding to said reset-indicating state, and a second position corresponding to said fault-indicating state, and wherein said reset circuit means include a winding for generating a magnetic field for positioning said mechanical member to said reset-indicating state.

6. A combined fault and voltage indicator for indicating the occurrence of a fault current and the presence of a voltage in an electrical conductor, comprising, in combination:
- a housing adapted for mounting on said conductor;
- status indicating means within said housing comprising a target member having a reset-indicating position and a fault-indicating position discernible from the exterior of said housing;
- fault detecting circuit means within said housing including a winding in magnetic communication with said target member for positioning said target member to said fault-indicating position in response to the occurrence of a fault current in the conductor, said fault circuit means being operable from an applied unidirectional current;
- reset circuit means within said housing including a winding in magnetic communication with said target member for positioning said target member to said reset position, said reset circuit means being periodically operable from an applied unidirectional current;
- a unidirectional current source within said housing operable from alternating current in said electrical conductor, the output voltage of said source being dependent on the voltage level of said alternating current, said unidirectional current source including a rectifier network having input and output terminals, one of said input terminals being capacitively coupled to said conductor and the other of said input terminals being connected to ground, and a first capacitor connected across said output terminals; and
- voltage indicating circuit means within said housing comprising a gas-discharge lamp visible from the exterior of said housing, and a second capacitor, said discharge lamp and said second capacitor being connected in series between said output terminals of said rectifier network, and said reset circuit means being connected across said second capacitor, whereby said periodic operation of said reset circuit periodically discharges said second capacitor and said discharge lamp periodically conducts to recharge said second capacitor, the rate of said periodic conduction being dependent on the voltage level in the conductor.

7. A combined fault and voltage indicator as defined in claim 6 wherein said fault detecting circuit means include a third capacitor and means including a diode serially connected between second capacitor and said third capacitor for preventing said reset circuit from discharging said third capacitor upon said periodic operation thereof.

8. A combined fault and voltage indicator as defined in claim 6 wherein said gas discharge lamp is a neon lamp.

* * * * *